United States Patent
Gatzhammer et al.

(10) Patent No.: US 10,411,157 B2
(45) Date of Patent: Sep. 10, 2019

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Christian Gatzhammer, Lupburg (DE); Martin Brandl, Kelheim (DE); Tobias Gebuhr, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/649,987

(22) Filed: Jul. 14, 2017

(65) Prior Publication Data

US 2017/0317233 A1    Nov. 2, 2017

Related U.S. Application Data

(63) Continuation of application No. PCT/EP2015/052176, filed on Feb. 3, 2015.

(30) Foreign Application Priority Data

Feb. 7, 2014  (DE) .................. 10 2014 101 556

(51) Int. Cl.
*H01L 33/10* (2010.01)
*H01L 33/48* (2010.01)
(Continued)

(52) U.S. Cl.
CPC .......... *H01L 33/105* (2013.01); *H01L 33/005* (2013.01); *H01L 33/486* (2013.01); *H05K 1/111* (2013.01); *H01L 33/62* (2013.01)

(58) Field of Classification Search
CPC .................................................... H01L 33/486
See application file for complete search history.

(56) References Cited

U.S. PATENT DOCUMENTS

2006/0084191 A1*  4/2006  Hwan ............... H01L 21/4832
                                                       438/17
2009/0050925 A1*  2/2009  Kuramoto ........... H01L 33/486
                                                       257/100
(Continued)

FOREIGN PATENT DOCUMENTS

CN    102569595       7/2012
CN    103247743 A     8/2013
(Continued)

OTHER PUBLICATIONS

First Office Action dated Nov. 23, 2017, of Chinese Application No. 201580007512.3 in English.

Primary Examiner — Daniel Whalen
(74) Attorney, Agent, or Firm — DLA Piper LLP (US)

(57) ABSTRACT

An optoelectronic component includes an optoelectronic semiconductor chip including first and second electrical contacts, a first leadframe section including a first chip contact pad and a first soldering contact pad situated opposite the first chip contact pad, and a second leadframe section including a second chip contact pad and a second soldering contact pad situated opposite the second chip contact pad, wherein the first electrical contact electrically conductively connects to the first chip contact pad and the second electrical contact electrically conductively connects to the second chip contact pad, the first and second leadframe sections are embedded into a housing such that at least parts of the first and second soldering contact pads are accessible at an underside, and a solder stop element is arranged at the underside of the housing, the solder stop element extending between the first soldering contact pad and the second soldering contact pad.

9 Claims, 2 Drawing Sheets

(51) Int. Cl.
*H01L 33/00* (2010.01)
*H05K 1/11* (2006.01)
*H01L 33/62* (2010.01)

(56) References Cited

U.S. PATENT DOCUMENTS

2011/0309404 A1   12/2011   Lee
2012/0193661 A1   8/2012   Emerson et al.
2013/0001633 A1   1/2013   Imai et al.
2013/0015479 A1   1/2013   Lin et al.
2013/0119426 A1   5/2013   Katoh et al.
2014/0291713 A1   10/2014   Lin et al.
2017/0084808 A1*   3/2017   Huang .................. H01L 33/486

FOREIGN PATENT DOCUMENTS

CN   104103734   10/2014
EP   2 490 269 A1   8/2012

\* cited by examiner

OPTOELECTRONIC COMPONENT AND METHOD FOR THE PRODUCTION THEREOF

TECHNICAL FIELD

This disclosure relates to an optoelectronic component and a method of producing an optoelectronic component.

BACKGROUND

It is known that, in electronic and optoelectronic components provided for surface mounting (SMD components), mutually adjacent soldering contact pads should not fall below a minimum distance of 200 µm. Otherwise a coalescence of solder and, hence, an electrical short circuit between the electrical contact pads may occur during a soldering mounting of the component. It is further known to form electrical contact pads of SMD components by leadframe sections embedded into a plastic housing. Electronic and optoelectronic semiconductor chips of such components may be arranged on the leadframe sections such that electrical contact pads of the semiconductor chips directly connect to the leadframe sections. Since the required minimum distance between the soldering contact pads in the prior art defines a minimum distance between the leadframe sections, this also results in a minimum size of the semiconductor chip that obstructs a further miniaturization.

SUMMARY

We provide an optoelectronic component including an optoelectronic semiconductor chip including a first electrical contact and a second electrical contact, a first leadframe section including a first chip contact pad and a first soldering contact pad situated opposite the first chip contact pad, and a second leadframe section including a second chip contact pad and a second soldering contact pad situated opposite the second chip contact pad, wherein the first electrical contact electrically conductively connects to the first chip contact pad and the second electrical contact electrically conductively connects to the second chip contact pad, the first leadframe section and the second leadframe section are embedded into a housing such that at least parts of the first soldering contact pad and the second soldering contact pad are accessible at an underside of the housing, and a solder stop element is arranged at the underside of the housing, the solder stop element extending between the first soldering contact pad and the second soldering contact pad.

We also provide a method of producing an optoelectronic component including embedding a first leadframe section including a first soldering contact pad and a second leadframe section including a second soldering contact pad into a housing such that at least parts of the first soldering contact pad and the second soldering contact pad remain accessible at an underside of the housing, arranging a solder stop element at the underside of the housing between the first soldering contact pad and the second soldering contact pad.

LIST OF REFERENCE SIGNS

Figure 1:
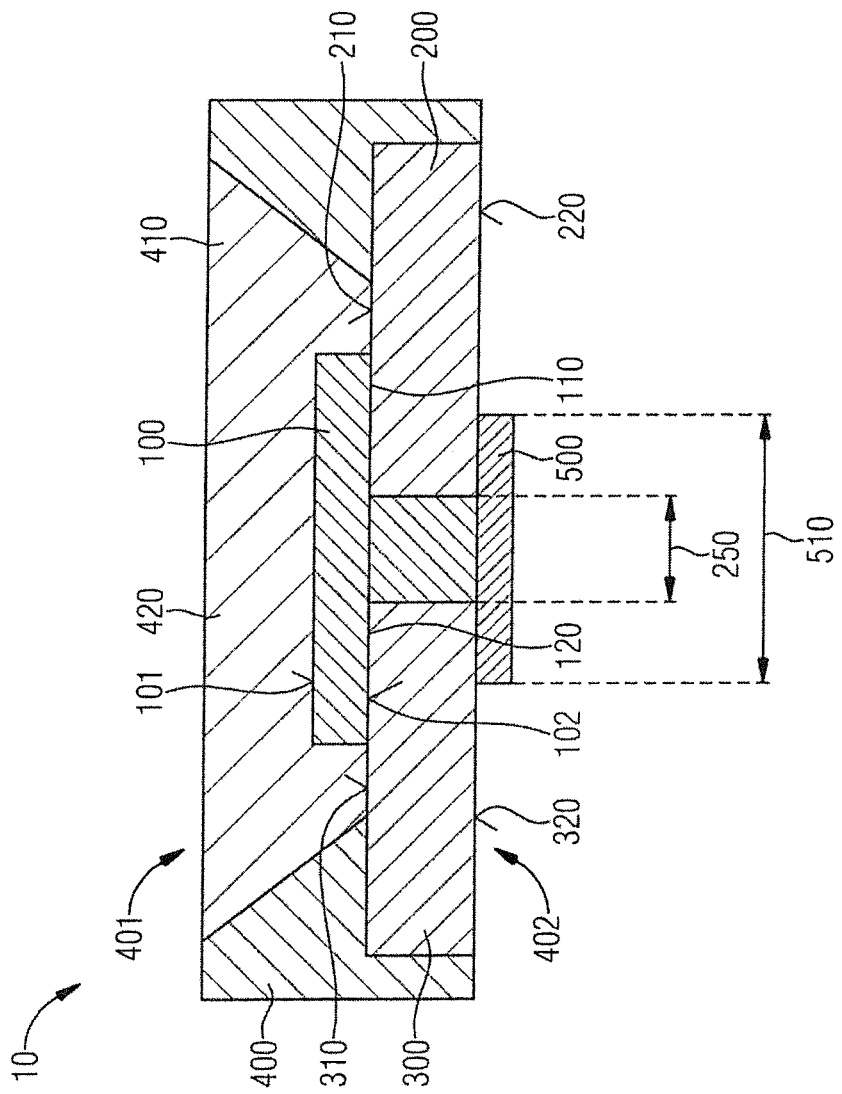
FIG. 1 shows a schematic sectional side view of an optoelectronic component.

10 Optoelectronic component
100 Optoelectronic semiconductor chip
101 Emission side
102 Contact side
110 First electrical contact
120 Second electrical contact
200 First leadframe section
210 First chip contact pad
220 First soldering contact pad
250 Distance
300 Second leadframe section
310 Second chip contact pad
320 Second soldering contact pad
400 Housing
401 Top side
402 Underside
410 Cavity
420 Potting material
500 Solder stop element
510 Edge length
600 Circuit board
610 First soldering contact pad
620 Second soldering contact pad
630 Distance

DETAILED DESCRIPTION

Our optoelectronic component comprises an optoelectronic semiconductor chip comprising a first electrical contact and a second electrical contact, a first leadframe section comprising a first chip contact pad and a first soldering contact pad situated opposite the first chip contact pad, and a second leadframe section comprising a second chip contact pad and a second soldering contact pad situated opposite the second chip contact pad. The first electrical contact electrically conductively connects to the first chip contact pad here and the second electrical contact electrically conductively connects to the second chip contact pad. The first leadframe section and the second leadframe section are embedded into a housing such that at least parts of the first soldering contact pad and the second soldering contact pad are accessible at an underside of the housing. A solder stop element is arranged at the underside of the housing, the solder stop element extending between the first soldering contact pad and the second soldering contact pad. Advantageously, the solder stop element arranged at the underside of the housing of this optoelectronic component brings about an electrical insulation between the first soldering contact pad of the first leadframe section and the second soldering contact pad of the second leadframe section. The solder stop element arranged at the underside of the housing additionally prevents in particular a coalescence of solder between the first soldering contact pad and the second soldering contact pad of the optoelectronic component. This advantageously prevents an undesired short circuit between the first soldering contact pad and the second soldering contact pad of the optoelectronic component.

The first soldering contact pad and the second soldering contact pad may comprise a distance of less than 200 µm. Advantageously, the optoelectronic component may be very compact as a result. In particular, the optoelectronic semiconductor chip of the optoelectronic component may also be very compact since the optoelectronic semiconductor chip only has to bridge a distance of less than 200 µm between the first soldering contact pad of the first leadframe section and the second soldering contact pad of the second leadframe section of the optoelectronic component.

The solder stop element may partly cover the first soldering contact pad and/or the second soldering contact pad.

Advantageously, the solder stop element thereby enlarges an effective distance between the first soldering contact pad and the second soldering contact pad, as a result of which an undesired short circuit between the first soldering contact pad and the second soldering contact pad of the optoelectronic component may advantageously be prevented despite a small distance between the first soldering contact pad and the second soldering contact pad.

The solder stop element may comprise an edge length of at least 200 µm. Advantageously, this makes it possible to largely ensure that a coalescence of solder between the first soldering contact pad and the second soldering contact pad and, hence, an electrical short circuit between the first soldering contact pad and the second soldering contact pad of the optoelectronic component do not occur during surface mounting of the optoelectronic component.

The first soldering contact pad and the second soldering contact pad may terminate flush with the underside of the housing. Advantageously, the optoelectronic component is thereby particularly well suited to a surface mounting.

The housing may comprise a cavity at a top side situated opposite the underside. In this case, at least parts of the first chip contact pad and of the second chip contact pad are accessible in the cavity. The optoelectronic semiconductor chip is arranged in the cavity. Advantageously, the cavity of the housing of the optoelectronic component may serve for mechanical protection of the optoelectronic semiconductor chip. Moreover, the cavity may serve as an optical reflector for electromagnetic radiation emitted by the optoelectronic semiconductor chip of the optoelectronic component. The cavity may also receive potting material embedding the optoelectronic semiconductor chip.

A potting material may be arranged in the cavity. Advantageously, the potting material may bring about protection of the optoelectronic semiconductor chip against damage as a result of external mechanical influences. The potting material may also comprise embedded converter particles provided to convert a wavelength of an electromagnetic radiation emitted by the optoelectronic semiconductor chip.

The first electrical contact and the second electrical contact may be arranged on a common surface of the optoelectronic semiconductor chip. In this case, the optoelectronic semiconductor chip may be a flip-chip, for example. Advantageously, this results in a particularly compact example of the optoelectronic semiconductor chip and of the optoelectronic component.

The optoelectronic semiconductor chip may be a volume emitting sapphire flip-chip. Advantageously, the optoelectronic semiconductor chip may have particularly compact dimensions as a result.

The surface of the optoelectronic semiconductor chip that comprises the electrical contacts may face the chip contact pads. As a result, there may be direct electrically conductive connections between the electrical contacts of the optoelectronic semiconductor chip and the chip contact pads of the leadframe sections of the optoelectronic component. By way of example, the electrical contacts may connect to the chip contact pads via soldering connections. A use of bond wires is advantageously not necessary.

A method of producing an optoelectronic component comprises steps of embedding a first leadframe section comprising a first soldering contact pad and a second leadframe section comprising a second soldering contact pad into a housing such that at least parts of the first soldering contact pad and the second soldering contact pad remain accessible at an underside of the housing, and arranging a solder stop element at the underside of the housing between the first soldering contact pad and the second soldering contact pad. Advantageously, this method makes it possible to produce an optoelectronic component comprising extremely compact dimensions. In this case, the solder stop element arranged at the underside of the housing ensures, despite the possible compact dimensions of the optoelectronic component, that a coalescence of solder between the first soldering contact pad and the second soldering contact pad and a resultant electrical short circuit between the first soldering contact pad and the second soldering contact pad do not occur during mounting of the optoelectronic component.

The method may comprise a further step of arranging an optoelectronic semiconductor chip in a cavity at a top side of the housing situated opposite the underside. Advantageously, the optoelectronic semiconductor chip may have extremely compact external dimensions.

The solder stop element may be applied as solder stop resist onto the underside of the housing. Advantageously, as a result, the method is implementable cost-effectively and is suitable for mass production.

Arranging the solder stop element may be performed by a mask. Advantageously, as a result, the method is implementable simply and cost-effectively and is suitable for mass production.

Embedding the first leadframe section and the second leadframe section into the housing may be performed by an injection molding method. Advantageously, as a result, the method is implementable simply and cost-effectively and is suitable for mass production.

The above-described properties, features and advantages and the way in which they are achieved will become clearer and more clearly understood in association with the following description of the examples explained in greater detail in association with the drawings.

FIG. 1 shows a schematic sectional side view of an optoelectronic component 10. The optoelectronic component 10 may be a light emitting diode component, for example.

The optoelectronic component 10 comprises an optoelectronic semiconductor chip 100. The optoelectronic semiconductor chip 100 may be a light emitting diode chip (LED chip), for example. The optoelectronic semiconductor chip 100 may be a flip-chip, for example. In particular, the optoelectronic semiconductor chip 100 may be a volume-emitting sapphire flip-chip, for example.

The optoelectronic semiconductor chip 100 comprises an emission side 101. The optoelectronic semiconductor chip 100 is configured to emit electromagnetic radiation, for example, visible light at its emission side 101. If the optoelectronic semiconductor chip 100 is a volume emitter, then the optoelectronic semiconductor chip 100 may emit electromagnetic radiation not only at the emission side 101, but also at other surfaces.

The optoelectronic semiconductor chip 100 comprises a contact side 102 situated opposite the emission side 101. A first electrical contact 110 and a second electrical contact 120 are arranged at the contact side 102 of the optoelectronic semiconductor chip 100. Between the first electrical contact 110 and the second electrical contact 120, an electrical voltage may be applied to the optoelectronic semiconductor chip 100 to cause the optoelectronic semiconductor chip 100 to emit electromagnetic radiation. The first electrical contact 110 may be an anode, for example. The second electrical contact 120 may be a cathode, for example. However, it is also possible for the first electrical contact 110 to be a cathode and the second electrical contact 120 as an anode.

The optoelectronic component 10 comprises a housing 400. The housing 400 comprises an electrically insulating material, preferably a plastics material. By way of example, the housing 400 may comprise an epoxy resin. The housing 400 may be produced, for example, by a molding method in particular, for example, by an injection molding method.

The housing 400 comprises a top side 401 and an underside 402 situated opposite the top side 401. At the top side 401 of the housing 400, the latter comprises a cavity 410. The cavity 410 may be, for example, a depression tapering (conically) in a funnel-shaped fashion.

A first leadframe section 200 and a second leadframe section 300 are embedded into the housing 400 of the optoelectronic component 10. The first leadframe section 200 and the second leadframe section 300 each comprise an electrically conductive material, preferably a metal. The first leadframe section 200 and the second leadframe section 300 are spaced apart from one another and electrically insulated from one another. The first leadframe section 200 and the second leadframe section 300 are preferably embedded into the material of the housing 400 already during production of the housing 400. In this case, the first leadframe section 200 and the second leadframe section 300 may be formed by sections of a common leadframe.

The first leadframe section 200 comprises a first chip contact pad 210 and a first soldering contact pad 220 situated opposite the first chip contact pad 210. The second leadframe section 300 comprises a second chip contact pad 310 and a second soldering contact pad 320 situated opposite the second chip contact pad 310. The first chip contact pad 210 and the second chip contact pad 310 may also be designated as bond pads. The chip contact pads 210, 310 of the leadframe sections 200, 300 and the soldering contact pads 220, 320 of the leadframe sections 200, 300 are each at least partly not covered by the material of the housing 400.

Parts of the first chip contact pad 210 of the first leadframe section 200 and parts of the second chip contact pad 310 of the second leadframe section 300 are exposed in the region of the cavity 410 of the housing 400. In this case, the chip contact pads 210, 310 of the leadframe sections 200, 300 are oriented in the same spatial direction as the top side 401 of the housing 400.

Parts of the first soldering contact pad 220 of the first leadframe section 200 and of the second soldering contact pad 320 of the second leadframe section 300 are exposed at the underside 402 of the housing 400. Preferably, the first soldering contact pad 220 and the second soldering contact pad 320 terminate flush with the underside 402 of the housing 400. The soldering contact pads 220, 320 of the leadframe sections 200, 300 of the optoelectronic component 10 are provided to electrically contact the optoelectronic component 10. The optoelectronic component 10 may be suitable for a surface mounting, for example. In this case, the soldering contact pads 220, 320 may be electrically contacted by reflow soldering, for example.

The optoelectronic semiconductor chip 100 of the optoelectronic component 10 is arranged in the cavity 410 of the housing 400 above the first chip contact pad 210 of the first leadframe section 200 and the second chip contact pad 310 of the second leadframe section 300. In this case, the contact side 102 of the optoelectronic semiconductor chip 100 faces the chip contact pads 210, 310. As a result, the emission side 101 of the optoelectronic semiconductor chip 100 is oriented in the same spatial direction as the top side 401 of the housing 400. Electromagnetic radiation emitted at the emission side 101 of the optoelectronic semiconductor chip 100 may be emitted at the top side 401 of the housing 400.

The first electrical contact 110 at the contact side 102 of the optoelectronic semiconductor chip 100 electrically conductively connects to the first chip contact pad 210 of the first leadframe section 200. The second electrical contact 120 at the contact side 102 of the optoelectronic semiconductor chip 100 electrically conductively connects to the second chip contact pad 310 of the second leadframe section 300 of the optoelectronic component 10. The connection between the electrical contacts 110, 120 and the chip contact pads 210, 310 may comprise, for example, an electrically conductive solder or an electrically conductive adhesive.

The first chip contact pad 210 of the first leadframe section 200 and the second chip contact pad 310 of the second leadframe section 300 comprise a distance 250 from one another. The distance 250 is preferably less than 200 µm. As a result, the first electrical contact 110 and the second electrical contact 120 of the optoelectronic semiconductor chip 100 may also comprise a small distance from one another, which makes it possible to embody the optoelectronic semiconductor chip 100 with small dimensions. Preferably, the first electrical contact 110 of the optoelectronic semiconductor chip 100 and the second electrical contact 120 of the optoelectronic semiconductor chip 100 also comprise a distance from one another of less than 200 µm.

As a result of the small distance 250 between the first chip contact pad 210 and the second chip contact pad 310, the first soldering contact pad 220 and the second soldering contact pad 320 may also comprise a small distance from one another. The distance between the first soldering contact pad 220 and the second soldering contact pad 320 may substantially correspond to the distance 250 between the first chip contact pad 210 and the second chip contact pad 310.

A solder stop element 500 is arranged at the underside 402 of the housing 400 of the optoelectronic component 10, the solder stop element extending between the first soldering contact pad 220 and the second soldering contact pad 320. The solder stop element 500 covers a part of the first soldering contact pad 220, a part of the underside 402 of the housing 400 and a part of the second soldering contact pad 320. In this case, the solder stop element 500 comprises an edge length 510 in a connection direction between the first soldering contact pad 220 and the second soldering contact pad 320. The edge length 510 is greater than the distance 250 between the chip contact pads 210, 310. Preferably, the edge length 510 is greater than 200 µm.

The solder stop element 500 comprises an electrically insulating material that is not wetted by solder. The solder stop element 500 may be arranged, for example, by a mask in the form of solder stop resist at the underside 402 of the housing 400.

A potting material 420 is arranged in the cavity 410 of the housing 400 of the optoelectronic component 10. The optoelectronic semiconductor chip 100 is embedded into the potting material 420. The potting material 420 may comprise a silicone, for example. The potting material 420 may protect the optoelectronic semiconductor chip 100 against damage as a result of external mechanical influences. The potting material 420 may additionally comprise embedded converter particles provided to convert a wavelength of an electromagnetic radiation emitted by the optoelectronic semiconductor chip 100. By way of example, the converter particles embedded into the potting material 420 may be configured to convert electromagnetic radiation having a wavelength from the ultraviolet or blue spectral range into white light. As an alternative or in addition to embedded converter particles, the potting material 420 may also comprise other embedded particles, for example, scattering particles. However, the potting material 420 may also be completely omitted.

The solder stop element 500 arranged at the underside 402 of the housing 400 of the optoelectronic component 10 may serve as a reflector for electromagnetic radiation emitted by the optoelectronic semiconductor chip 100 in the direction of the underside 402 of the housing 400. Electromagnetic radiation reflected at the solder stop element 500 may once again pass through the housing 400 of the optoelectronic component 10 and be emitted at the top side 401 of the housing 400. Light losses of the optoelectronic component 10 may advantageously be reduced as a result.

Figure 2:
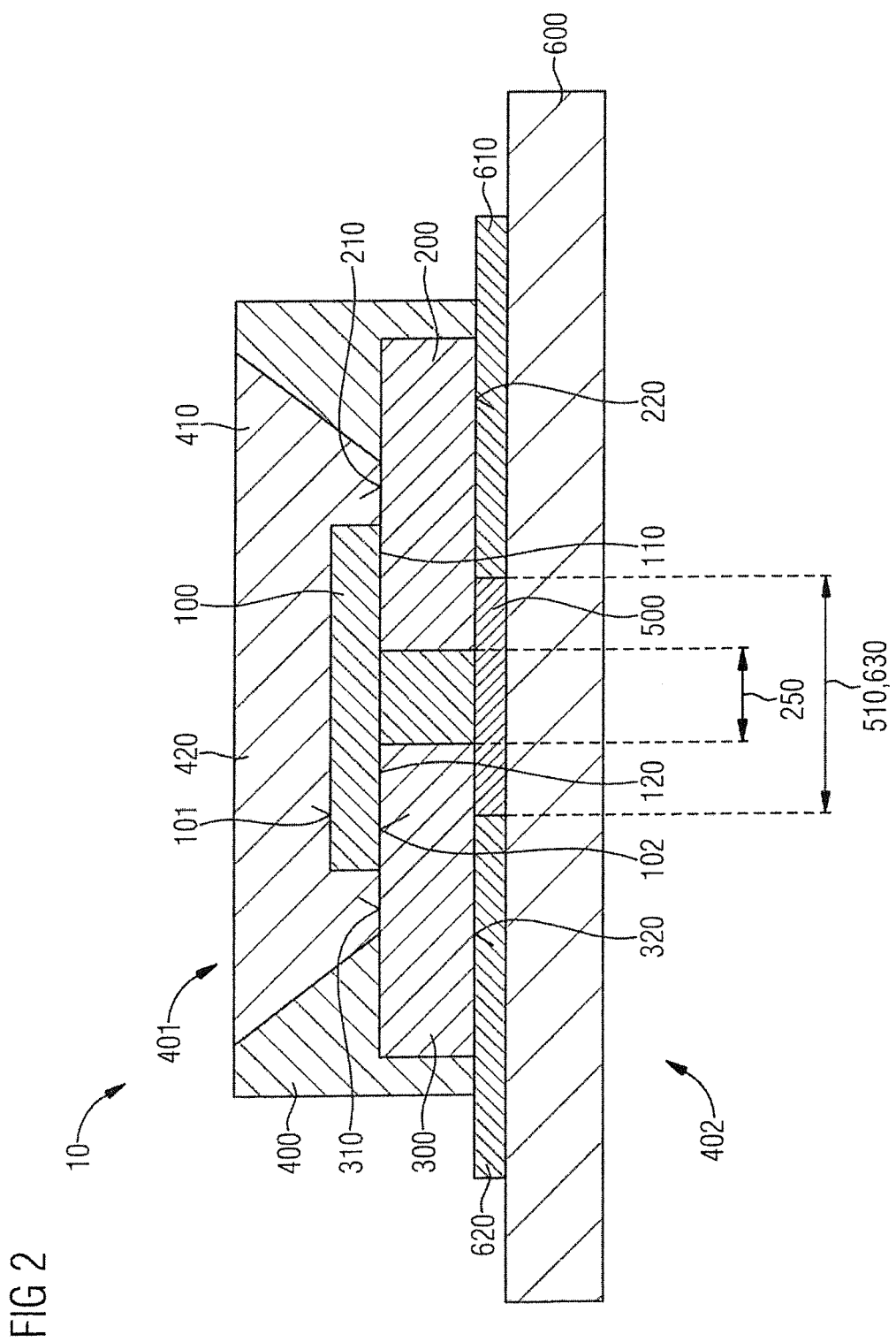
FIG. 2 shows a schematic sectional side view of the optoelectronic component after mounting on a circuit board.

FIG. 2 shows a further schematic sectional side view of the optoelectronic component 10. In the illustration in FIG. 2, the optoelectronic component 10 is arranged on a circuit board 600.

The circuit board 600 may also be designated as a printed circuit board or as a PCB. A first soldering contact pad 610 and a second soldering contact pad 620 are arranged at a top side of the circuit board 600. The first soldering contact pad 610 and the second soldering contact pad 620 may be connected to further circuit parts via conductor tracks and other electrically conductive connections that are not illustrated in FIG. 2.

The optoelectronic component 10 is arranged above the top side of the circuit board 600 such that the underside 402 of the housing 400 of the optoelectronic component 10 faces the top side of the circuit board 600. The first soldering contact pad 220 of the first leadframe section 200 of the optoelectronic component 10 electrically conductively connects to the first soldering contact pad 610 of the circuit board 600. The second soldering contact pad 320 of the second leadframe section 300 of the optoelectronic component 10 electrically conductively connects to the second soldering contact pad 620 of the circuit board 600. The soldering contact pads 220, 320 of the optoelectronic component 10 may have been connected to the soldering contact pads 610, 620 of the circuit board 600, for example, by reflow soldering or by some other method of surface mounting.

The first soldering contact pad 610 and the second soldering contact pad 620 of the circuit board 600 comprise a distance 630 from one another. The magnitude of the distance 630 preferably corresponds approximately to the edge length 510 of the solder stop element 500. In particular, the distance 630 between the soldering contact pads 610, 620 of the circuit board 600 is preferably greater than 200 µm.

The distance 630 between the first soldering contact pad 610 and the second soldering contact pad 620 of the circuit board 600 and the solder stop element 500 arranged between the first soldering contact pad 220 and the second soldering contact pad 320 of the optoelectronic component 10 prevented, during the production of the soldering connections between the soldering contact pads 220, 320 of the optoelectronic component 10 and the soldering contact pads 610, 620 of the circuit board 600, solder from passing between the first soldering contact pad 610 and the second soldering contact pad 620 of the circuit board 600 and/or between the first soldering contact pad 220 and the second soldering contact pad 320 of the optoelectronic component 10 and causing a short circuit between the first soldering contact pads 220, 610 and the second soldering contact pads 320, 620.

Our components and methods have been illustrated and described in greater detail on the basis of the preferred examples. Nevertheless, this disclosure is not restricted to the examples disclosed. Rather, other variations may be derived therefrom by those skilled in the art without departing from the scope of protection of the appended claims.

This application claims priority of DE 10 2014 101 556.8, the subject matter of which is incorporated herein by reference.

The invention claimed is:

1. An optoelectronic component comprising:
   an optoelectronic semiconductor chip comprising a first electrical contact and a second electrical contact,
   a first leadframe section comprising a first chip contact pad and a first soldering contact pad situated opposite the first chip contact pad, and
   a second leadframe section comprising a second chip contact pad and a second soldering contact pad situated opposite the second chip contact pad,
   wherein the first electrical contact electrically conductively connects to the first chip contact pad and the second electrical contact electrically conductively connects to the second chip contact pad,
   the first leadframe section and the second leadframe section are embedded into a housing such that at least parts of the first soldering contact pad and the second soldering contact pad are accessible at an underside of the housing,
   a solder stop element is arranged at the underside of the housing, said solder stop element extending between the first soldering contact pad and the second soldering contact pad,
   the housing comprises a cavity at a top side situated opposite the underside,
   at least parts of the first chip contact pad and of the second chip contact pad are accessible in the cavity,
   the optoelectronic semiconductor chip is arranged in the cavity, and
   the optoelectronic semiconductor chip is arranged above the first leadframe section and above the second leadframe section.

2. The optoelectronic component according to claim 1, wherein the first chip contact pad and the second chip contact pad comprise a distance of less than 200 µm.

3. The optoelectronic component according to claim 1, wherein the solder stop element partly covers the first soldering contact pad and/or the second soldering contact pad.

4. The optoelectronic component according to claim 1, wherein the solder stop element comprises an edge length of at least 200 µm.

5. The optoelectronic component according to claim 1, wherein the first soldering contact pad and the second soldering contact pad terminate flush with the underside of the housing.

6. The optoelectronic component according to claim 1, wherein a potting material is arranged in the cavity.

7. The optoelectronic component according to claim 1, wherein the first electrical contact and the second electrical contact are arranged on a common surface of the optoelectronic semiconductor chip.

8. The optoelectronic component according to claim 7, wherein the optoelectronic semiconductor chip is a volume emitting sapphire flip-chip.

9. The optoelectronic component according to claim 1, wherein the first electrical contact and the second electrical contact are arranged on a common surface of the optoelectronic semiconductor chip, and the surface of the optoelectronic semiconductor chip comprising the electrical contacts faces the chip contact pads.

\* \* \* \* \*